(12) United States Patent
Lee et al.

(10) Patent No.: US 11,404,464 B2
(45) Date of Patent: Aug. 2, 2022

(54) IMAGE SENSING DEVICE AND METHOD OF FORMING THE SAME

(71) Applicant: Silicon Optronics, Inc., Hsinchu (TW)

(72) Inventors: Bo-Ray Lee, Hsinchu (TW); Ming-Xiang Li, Hsinchu (TW)

(73) Assignee: SILICON OPTRONICS, INC., Hsinchu (TW)

( * ) Notice: Subject to any disclaimer, the term of this patent is extended or adjusted under 35 U.S.C. 154(b) by 245 days.

(21) Appl. No.: 15/931,713

(22) Filed: May 14, 2020

(65) Prior Publication Data
US 2021/0358988 A1    Nov. 18, 2021

(30) Foreign Application Priority Data

Oct. 9, 2019   (TW) .................................. 108136559

(51) Int. Cl.
| | |
|---|---|
| *H01L 27/146* | (2006.01) |
| *G02B 5/10* | (2006.01) |
| *G02B 5/18* | (2006.01) |
| *G02B 5/20* | (2006.01) |
| *G02B 3/00* | (2006.01) |

(52) U.S. Cl.
CPC ...... *H01L 27/14629* (2013.01); *G02B 3/0006* (2013.01); *G02B 5/10* (2013.01); *G02B 5/1809* (2013.01); *G02B 5/201* (2013.01); *H01L 27/1463* (2013.01); *H01L 27/1464* (2013.01); *H01L 27/14621* (2013.01); *H01L 27/14625* (2013.01); *H01L 27/14627* (2013.01); *H01L 27/14636* (2013.01); *H01L 27/14645* (2013.01); *H01L 27/14685* (2013.01)

(58) Field of Classification Search
CPC ......... H01L 27/14629; H01L 27/14621; H01L 27/14625; H01L 27/14627; H01L 27/1463; H01L 27/14636; H01L 27/14645; H01L 27/14685; G02B 3/0006; G02B 5/10; G02B 5/1809; G02B 5/201
See application file for complete search history.

(56) References Cited

U.S. PATENT DOCUMENTS

2013/0063641 A1*   3/2013   Venezia ............ H01L 27/14629
                                                               348/308
2018/0342543 A1    11/2018  Liu et al.

FOREIGN PATENT DOCUMENTS

| CN | 109616487 A | 4/2019 |
|---|---|---|
| KR | 10-0653848 B1 | 11/2006 |
| TW | 2009-50067 A | 12/2009 |
| TW | 2012-08048 A | 2/2012 |
| TW | 2013-51623 A | 12/2013 |

(Continued)

*Primary Examiner* — Robert G Bachner
(74) *Attorney, Agent, or Firm* — Muncy, Geissler, Olds & Lowe, P.C.

(57) ABSTRACT

An image sensing device is provided. The image sensing device includes a substrate, a plurality of photosensitive elements, a dielectric layer, a reflector, a color filter, and a microlens structure. The substrate has a first pixel and a second pixel adjacent to the first pixel, and the substrate has a front side and a back side opposite the front side. The photosensitive elements are disposed in the substrate. The dielectric layer is disposed on the back side of the substrate. The reflection is disposed on the front side of the substrate and has a parabolic surface. The color filter layer is disposed on the dielectric layer. The microlens structure is disposed on the color filter layer.

20 Claims, 7 Drawing Sheets

(56) References Cited

FOREIGN PATENT DOCUMENTS

| TW | 2014-05782 A | 2/2014 |
| TW | 2017-15713 A | 5/2017 |
| TW | 2019-24074 A | 6/2019 |
| TW | 2019-26733 A | 7/2019 |

* cited by examiner

IMAGE SENSING DEVICE AND METHOD OF FORMING THE SAME

CROSS REFERENCE TO RELATED APPLICATIONS

This Application claims priority of Taiwan Patent Application No. 108136559, filed on Oct. 9, 2019, the entirety of which is incorporated by reference herein.

BACKGROUND OF THE INVENTION

Field of the Invention

The present invention relates to an image sensing device, and in particular, it relates to a back side illumination (BSI) image sensing device.

Description of the Related Art

Image sensing devices have been widely used in various image capturing devices, such as cameras, digital cameras, and the like. The image sensing device, such as a charge-coupled device (CCD) image sensing device or a complementary metal-oxide semiconductor (CMOS) image sensing device, has a photosensitive element for converting incident light into an electrical signal. The image sensing device has a pixel array, and each pixel has one photosensitive element. The image sensing device also has logic circuitry for transmitting and processing electrical signals.

Although the existing image sensing devices can substantially meet their originally intended use, they have not yet fully met the requirements in every respect. For example, when incident light passes through a substrate containing a photosensitive element, the incident light is not reflected back to the substrate, and when the wavelength of light is too long or the thickness of the substrate is insufficient, the aforementioned phenomenon generally occurs. As a result, most of the energy is lost in the wire layer.

Therefore, there is a need for a novel image sensing device to reduce the loss of energy in the wire layer.

BRIEF SUMMARY OF THE INVENTION

According to the embodiments of the present invention, an image sensing device and a method of forming the same are provided. The image sensing device according to the embodiments of the invention includes a reflection layer disposed on the front side of the back side illumination image sensing device. When incident light passes through the substrate, it can be reflected back to the substrate, increasing the absorption path of the incident light in the substrate, thereby reducing energy loss in the wire layer. In addition, since the reflection layer has a parabolic surface, the incident light can be further prevented from being reflected into other pixels, thereby avoiding crosstalk.

According to some embodiments of the present invention, an image sensing device is provided. The image sensing device includes a substrate, a plurality of photosensitive elements, a dielectric layer, a reflector, a color filter, and a microlens structure. The substrate has a first pixel and a second pixel adjacent to the first pixel, and the substrate has a front side and a back side opposite the front side. The photosensitive elements are disposed in the substrate. The dielectric layer is disposed on the back side of the substrate. The reflection layer is disposed on the front side of the substrate and has a parabolic surface. The color filter layer is disposed on the dielectric layer. The microlens structure is disposed on the color filter layer.

According to some embodiments of the present invention, a method of forming an image sensing device is provided. The method includes: providing a substrate, wherein the substrate has a first pixel and a second pixel adjacent to the first pixel, and the substrate has a front side and a back side opposite the front side; forming a plurality of photosensitive elements in the substrate; forming a dielectric layer on the back side of the substrate; forming a reflection layer on the front side of the substrate, wherein the reflection layer has a parabolic surface; forming a color filter layer on the dielectric layer; and forming a microlens on the color filter layer.

BRIEF DESCRIPTION OF THE DRAWINGS

The embodiments of the present invention will be described in detail below with reference made to the accompanying drawings. It should be noted that, in accordance with standard practice in the industry, the various features are not drawn to scale and are merely illustrative. In fact, the dimensions of the elements may be arbitrarily enlarged or reduced to clearly show the features of the embodiments of the present invention.

DETAILED DESCRIPTION OF THE INVENTION

The image sensing device and the method of forming the same according to embodiments of the present invention will be described in detail below. It should be appreciated that the following disclosure provides many different embodiments, or examples, for implementing different features of the invention to clearly describe the present invention. In addition, similar and/or corresponding reference numerals may be used in different embodiments to indicate similar and/or corresponding elements in order to clearly describe the embodiments of the present invention. However, the use of such similar and/or corresponding reference numerals is for the purpose of simplicity and clarity and does not in itself dictate a relationship between the various embodiments and/or configurations discussed.

In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that although the terms "first", "second", "third" etc. may be used herein to describe various elements, components, regions, layers, and/or portions, these elements, components, regions, layers, and/or portions should not be limited by these terms. These terms are only used to distinguish one element, component, region, layer, and/or portion from another element, component, region, layer and/or portion. Thus, a first element, component, region, layer, and/or portion discussed below could be termed a second element, component, region, layer, and/or portion without departing from the teachings of the present invention.

Herein, the terms "about", "approximately" and "substantially" typically mean +/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. The stated value of the present invention is an approximate value. Namely, the meaning of "about", "approximately" and "substantially" may be implied if there is no specific description of "about", "approximately" and "substantially".

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed as referring to the orientation as described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Unless defined otherwise, all technical and scientific terms used herein have the same meaning as commonly understood by one of ordinary skill in the art to which this invention belongs. It should be appreciated that, in each case, the term, which is defined in a commonly used dictionary, should be interpreted as having a meaning that conforms to the relative skills of the present invention and the background or the context of the present invention, and should not be interpreted in an idealized or overly formal manner unless so defined.

It should be noted that the term "substrate" is meant to include devices formed within a semiconductor wafer and the layers overlying the wafer. All semiconductor element needed may be already formed over the substrate. However, the substrate is represented with a flat surface in order to simplify the drawing. In addition, the term "substrate surface" is meant to include the uppermost exposed layers on a semiconductor wafer, such as silicon surface, insulating layer and/or metallurgy lines.

This description of the exemplary embodiments is intended to be read in connection with the accompanying drawings, which are to be considered part of the entire written description. The drawings are not drawn to scale. The shapes and thicknesses of the embodiments may be exaggerated in the drawings in order to clearly illustrate the features of the embodiments of the present invention. In addition, the structures and devices in the drawings are schematically illustrated in order to clearly illustrate the features of the embodiments of the invention.

Although the steps in some of the described embodiments are performed in a particular order, these steps can also be performed in other logical orders. In various embodiments, some of the described steps may be replaced or omitted, and some other operations may be performed before, during, and/or after the steps described in the embodiments of the present invention. The image sensing device in the embodiments of the invention may incorporate other features. Some features may be replaced or omitted in different embodiments.

Embodiments of the present invention provide an image sensing device and a method of forming the same. By disposing a reflection layer having a parabolic surface under the front side of the substrate containing the photosensitive element, the incident light can be reflected back to the substrate after passing through the substrate, thereby increasing the absorption path of the incident light in the substrate containing the photosensitive element, thereby reducing energy loss in the wire layer. In addition, since the reflective layer has a parabolic surface, the incident light can be prevented from being reflected into other pixels, which further avoids crosstalk.

Figure 1:
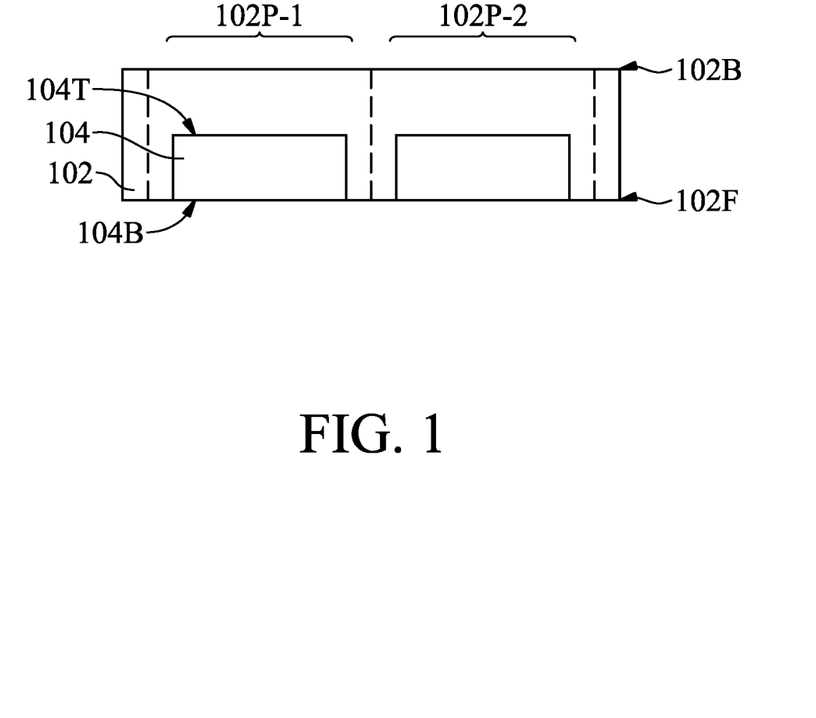
FIG. 1 is a cross-sectional view illustrating one stage of forming an image sensing device 100A in accordance with some embodiments of the present invention.

FIGS. 1 to 11 are cross-sectional views illustrating various stages of forming an image sensing device 100A in accordance with some embodiments of the present invention. The image sensing device 100A includes a substrate 102. As shown in FIG. 1, the substrate 102 has a first pixel 102P-1 and a second pixel 102P-2 adjacent to the first pixel 102P-1. The substrate 102 has a front side 102F and a back side 102B opposite the front side 102F. One of ordinary skill in the art can understand that the image sensing device contains a plurality of pixels, and only two pixels are illustrated for simplicity of the embodiments of the present invention.

In some embodiments of the invention, the substrate 102 is a bulk semiconductor substrate, such as a semiconductor wafer. For example, the substrate 102 is a silicon wafer. The substrate 102 may include silicon or another elemental semiconductor material, such as germanium. In other embodiments, the substrate 102 includes a compound semiconductor. The compound semiconductor may include gallium arsenide (GaAs), silicon carbide (SiC), indium arsenide (InAs), indium phosphide (InP), gallium phosphide (GaP), another suitable material, or a combination thereof.

In some embodiments, the substrate 102 includes a semiconductor-on-insulator (SOI) substrate. A semiconductor-on-insulator (SOI) substrate can be fabricated using a separation by implantation of oxygen (SIMOX) process, a wafer bonding process, another suitable method or a combination thereof. In some embodiments, the substrate 102 is an undoped substrate.

The image sensing device 100A includes a photosensitive element 104 corresponding to one pixel. The photosensitive element 104 is disposed in the substrate 102. To be specific, the bottom surface 104B of the photosensitive element 104 can be substantially coplanar with the front side 102F of the substrate 102. In some embodiments, the top surface 104T of the photosensitive element 104 can be substantially coplanar with the back side 102B of the substrate 102. In other embodiments, the top surface 104T of the photosensitive element 104 is not coplanar with the back side 102B of the substrate 102, and the bottom surface 104B of the photosensitive element 104 is not coplanar with the front side 102F of the substrate 102. In other words, the photosensitive element 104 can be buried in the substrate 102.

In some embodiments, the photosensitive element 104 may include a photodiode, but is not limited thereto. The photosensitive element 104 can receive incident light and convert it into an electrical signal. To be specific, according to some embodiments, the photodiode may include a $p^+$/n/p-diode, an $n^+$/p/n-diode, a source and a drain of a metal oxide semiconductor (MOS) transistor (not shown), and the source and the drain can convey current to other components, such as other metal oxide semiconductor transistors.

In addition, the photosensitive element 104 can include a transfer gate, a reset gate, a source-follow gate, and a row-select gate, or a combination thereof. Furthermore, the photosensitive element 104 can be further coupled to an external device to transmit the digital signal to an external device, such as a signal processor.

Figure 2:
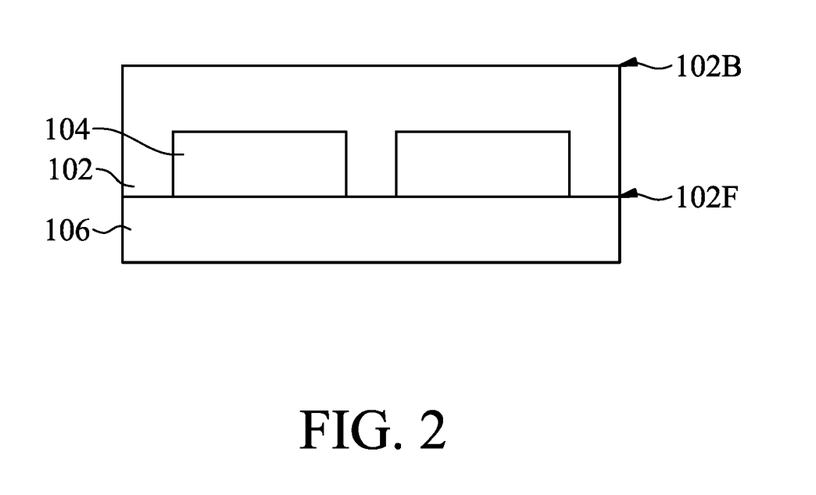
FIG. 2 is a cross-sectional view illustrating one stage of forming an image sensing device 100A in accordance with some embodiments of the present invention.

Next, referring to FIG. 2, a dielectric layer 106 is formed on the front side 102F of the substrate 102. The material of the dielectric layer 106 may include, but is not limited to, an organic transparent material, a dielectric material, any other suitable transparent material, or a combination thereof. In some embodiments, the dielectric material includes $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, $AlSiN_3$, SiC, $Ta_2O_5$, other suitable dielectric materials or a combination thereof.

In some embodiments, the dielectric layer 106 is deposited by using chemical vapor deposition (CVD), sputtering, resistive thermal evaporation, electron beam evaporation, other suitable methods or a combination thereof. In some embodiments of the present invention, the chemical vapor deposition may include, but is not limited to, low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), and the like.

Figure 3:
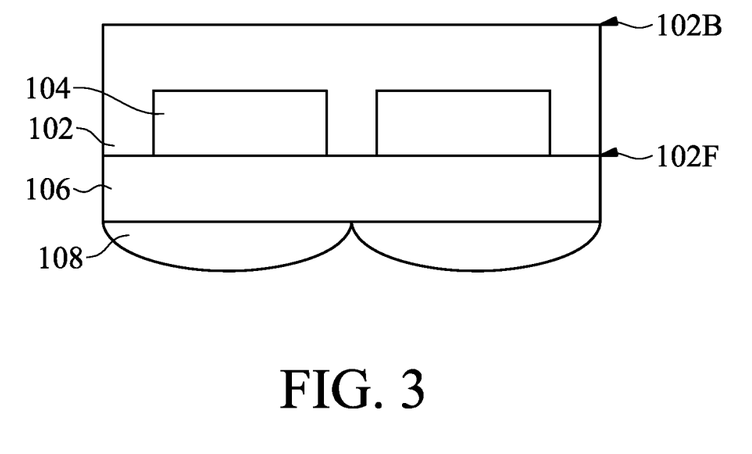
FIG. 3 is a cross-sectional view illustrating one stage of forming an image sensing device 100A in accordance with some embodiments of the present invention.

Next, referring to FIG. 3, a photoresist material is formed on the bottom surface of the dielectric layer 106 by a suitable process, such as spin coating or chemical vapor deposition, atomic layer deposition, physical vapor deposition, molecular beam deposition, plasma enhanced chemical vapor deposition, other suitable methods or a combination thereof. Then, optical exposure, post-exposure baking and development are performed to remove a portion of the photoresist material to form a patterned photoresist. The patterned photoresist layer will serve as a first hard mask 108 for etching. A bi- or tri-layered photoresist can be performed.

Figure 4:
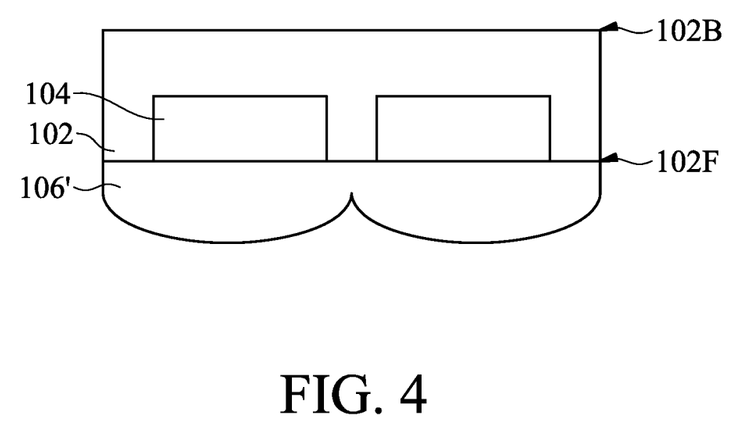
FIG. 4 is a cross-sectional view illustrating one stage of forming an image sensing device 100A in accordance with some embodiments of the present invention.

An etching process is then performed on the dielectric layer 106. In some embodiments, an etching selectivity ratio of the first hard mask 108 to the dielectric layer 106 may be about 1:0.8, and the etching process may be a dry etching. The dry etching may be performed using a fluorine-based process gas, such as $CF_4$, $CHF_3$, and the like. After the etching process, the upper portion of the dielectric layer 106 is etched and formed as a parabolic surface, while the lower portion of the dielectric layer 106 is not etched and remains on the substrate 102. At this point, the first hard mask 108 is also removed, a patterned dielectric layer 106' as shown in FIG. 4 is formed, and the bottoms of adjacent regions of the patterned dielectric layer 106' are connected to each other.

Figure 5:
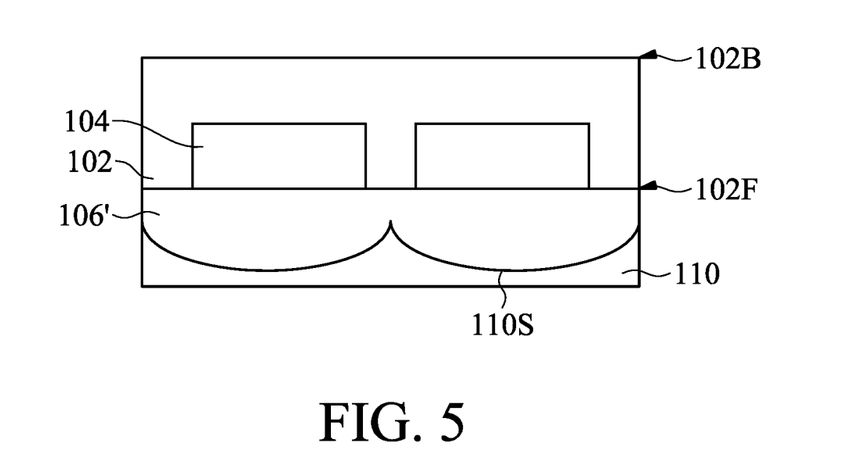
FIG. 5 is a cross-sectional view illustrating one stage of forming an image sensing device 100A in accordance with some embodiments of the present invention.

Next, referring to FIG. 5, a reflection layer 110 is conformally formed on the patterned dielectric layer 106'. In some embodiments, the reflection layer 110 is deposited by using chemical vapor deposition, sputtering, resistive thermal evaporation, electron beam evaporation, other suitable methods, or a combination thereof. In some embodiments of the present invention, the chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, and the like. Then, a planarization process, such as a chemical mechanical polishing process, is performed on the reflection layer 110.

The material of the reflection layer 110 may include copper, aluminum, molybdenum, tungsten, gold, chromium, nickel, platinum, titanium, tantalum, niobium, other highly conductive metal materials, an alloy thereof or a combination thereof.

As shown in FIG. 5, the reflection layer 110 has a parabolic surface 110S. The curvature radius of the parabolic surface 110S of the reflection layer 110 can be between 0.3 μm and 10 μm. For example, the curvature radius of the parabolic surface 110S can be between 1 μm and 5 μm.

Figure 6:
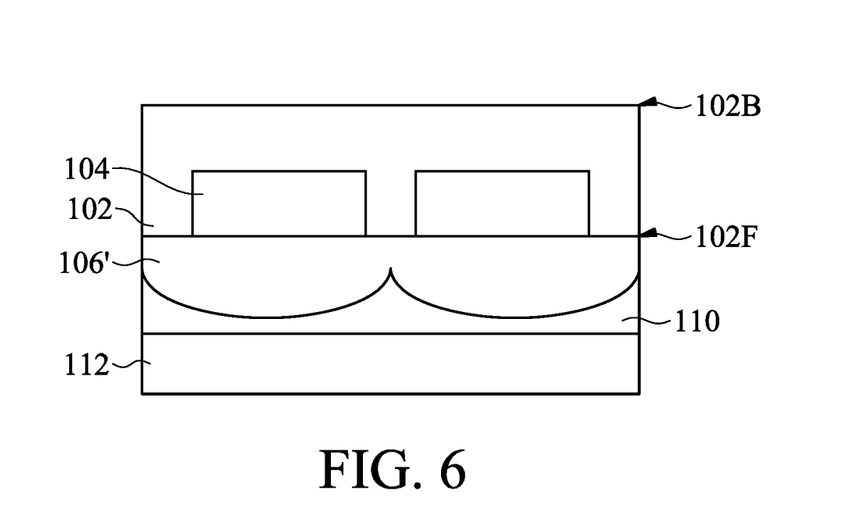
FIG. 6 is a cross-sectional view illustrating one stage of forming an image sensing device 100A in accordance with some embodiments of the present invention.

Next, referring to FIG. 6, a wire layer 112 is formed on the front side 102F of the substrate 102. To be specific, the reflection layer 110 is disposed between the substrate 102 and the wire layer 112. The wire layer 112 includes an interconnect structure (not shown).

Figure 7:
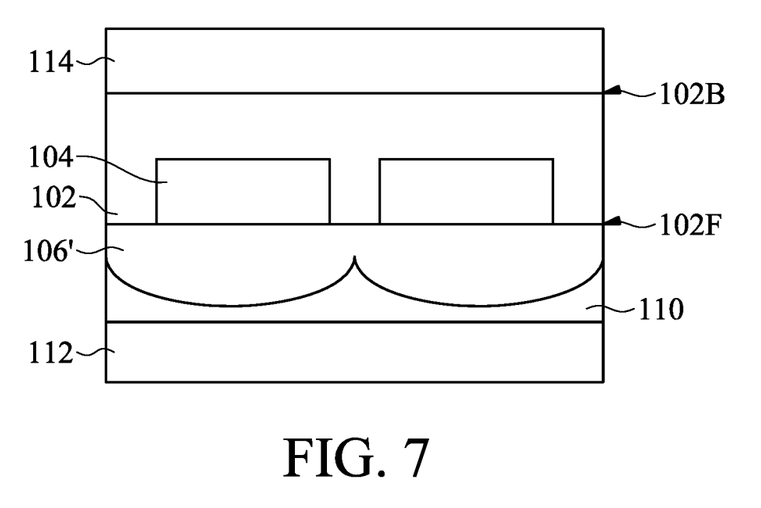
FIG. 7 is a cross-sectional view illustrating one stage of forming an image sensing device 100A in accordance with some embodiments of the present invention.

Next, referring to FIG. 7, a dielectric layer 114 is formed on the back side 102B of the substrate 102. In some embodiments, the dielectric layer 114 is deposited by using chemical vapor deposition, sputtering, resistive thermal evaporation, electron beam evaporation, other suitable methods, or a combination thereof. In some embodiments of the present invention, the chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, and the like.

The material of the dielectric layer 114 includes $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, $AlSiN_3$, SiC, $Ta_2O_5$, other suitable dielectric materials or a combination thereof.

Figure 8:
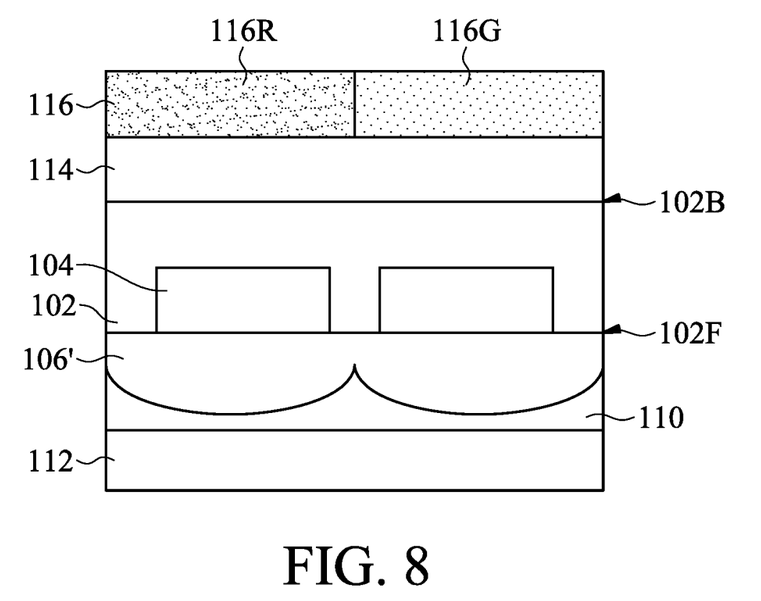
FIG. 8 is a cross-sectional view illustrating one stage of forming an image sensing device 100A in accordance with some embodiments of the present invention.

Next, referring to FIG. 8, a color filter layer 116 is formed on the dielectric layer 114. The color filter layer 116 includes a plurality of color filter components, such as a red filter component 116R and a green filter component 116G, respectively. In some embodiments, the color filter components can have other colors, and these color filter components of different colors can be arranged in other arrangements. Each of the color filter components corresponds to one of the photosensitive elements 104 in each of the pixels.

Figure 9:
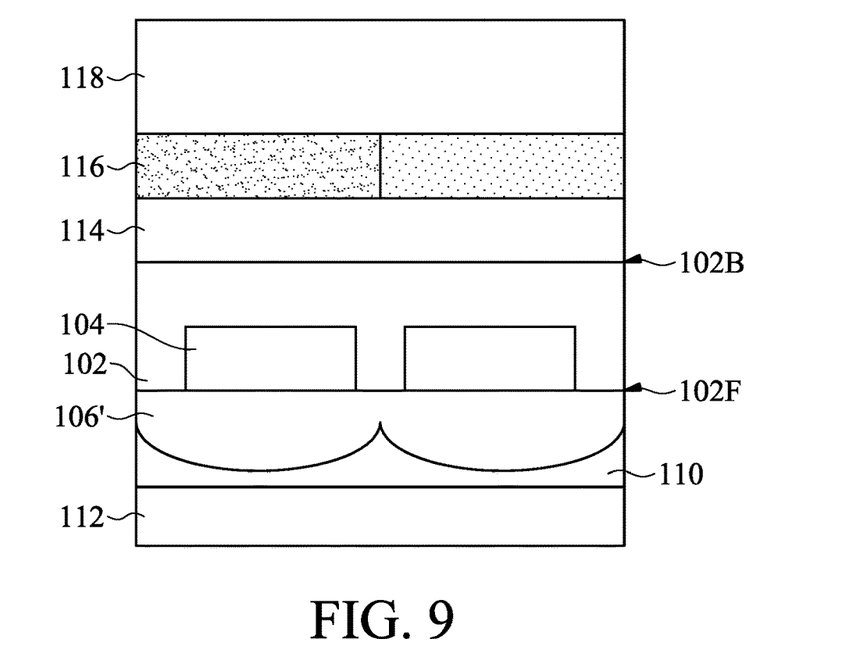
FIG. 9 is a cross-sectional view illustrating one stage of forming an image sensing device 100A in accordance with some embodiments of the present invention.

Next, referring to FIG. 9, a microlens material 118 is formed on the color filter layer 116. In some embodiments, the microlens material 118 is deposited by using chemical vapor deposition, sputtering, resistive thermal evaporation, electron beam evaporation, other suitable methods, or a combination thereof. In some embodiments of the present invention, the chemical vapor deposition may include, but is not limited to, low-pressure chemical vapor deposition, low-temperature chemical vapor deposition, rapid thermal chemical vapor deposition, plasma enhanced chemical vapor deposition, atomic layer deposition, and the like. The material of the microlens material 118 includes a transparent organic material.

Figure 10:
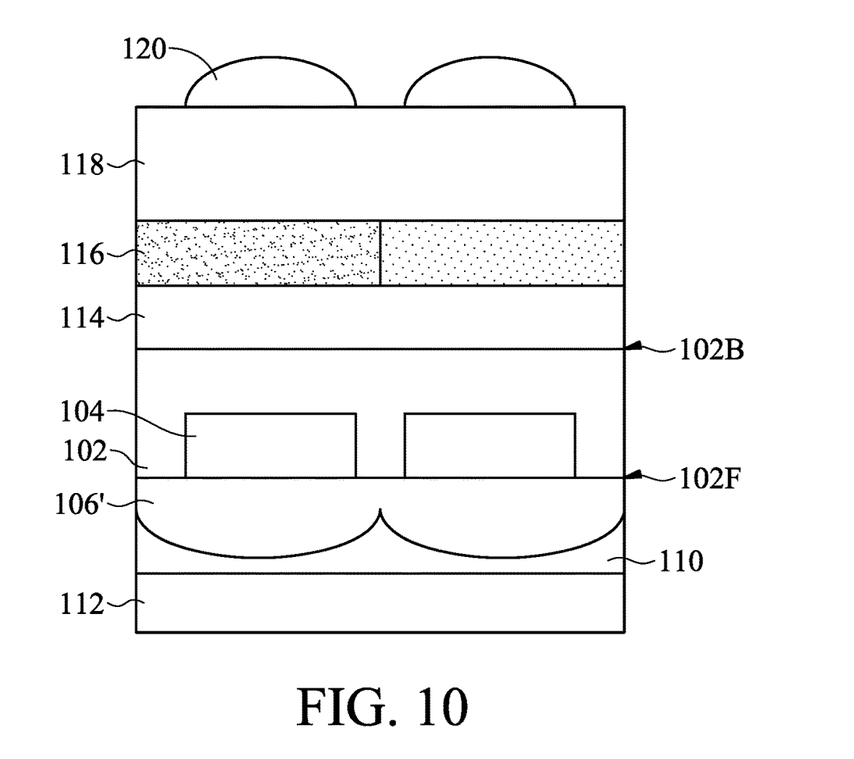
FIG. 10 is a cross-sectional view illustrating one stage of forming an image sensing device 100A in accordance with some embodiments of the present invention.

Next, referring to FIG. 10, a photoresist material is formed on the microlens material 118 by a suitable process, such as spin coating or chemical vapor deposition, atomic layer deposition, physical vapor deposition, molecular beam deposition, plasma enhanced chemical vapor deposition, other suitable methods or a combination thereof. Then, optical exposure, post-exposure baking and development are performed to remove a portion of the photoresist material to form a patterned photoresist. The patterned photoresist layer will serve as a second hard mask 120 for etching. A bi- or tri-layered photoresist can be performed.

Figure 11:
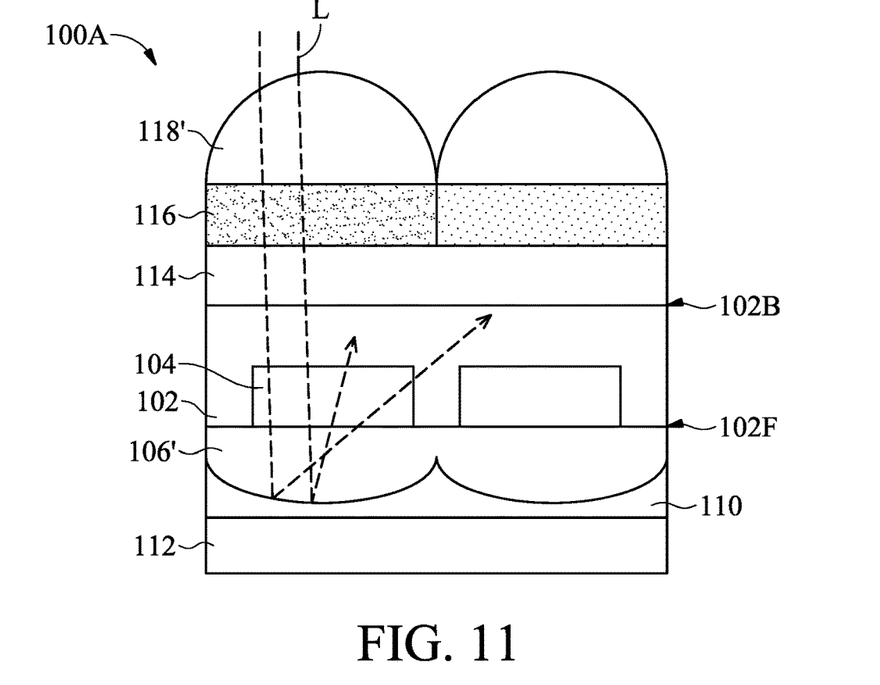
FIG. 11 is a cross-sectional view illustrating one stage of forming an image sensing device 100A in accordance with some embodiments of the present invention.

An etching process is then performed on the microlens material 118. In some embodiments, an etching selectivity ratio of the second hard mask 120 to the microlens material 118 may be about 1:0.8, and the etching process may be a dry etching. The dry etching may be performed using a fluorine-based process gas, such as $CF_4$, $CHF_3$, and the like. After the etching process, the upper portion of the microlens material 118 is etched and formed as a parabolic surface, while the lower portion of the microlens material 118 is not etched and remains on the color filter layer 116. At this point, the second hard mask 120 is also removed, and a microlens structure 118' as shown in FIG. 11 is formed. The microlens structure 118' has a convex contoured surface.

As shown in FIG. 11, by disposing the reflection layer 110 having a parabolic surface on the front side 102F of the substrate 102 containing the photosensitive element 104, the incident light L can be reflected back to the substrate 102 after passing through the substrate 102, thereby increasing the absorption path of the incident light L in the substrate 102 containing the photosensitive element 104, thereby reducing energy loss in the wire layer 112. In addition, since the reflection layer 110 has a parabolic surface 110S, the incident light L can be prevented from being reflected into other pixels, which further avoids crosstalk. The path of the incident light L is merely illustrative.

Figure 12:
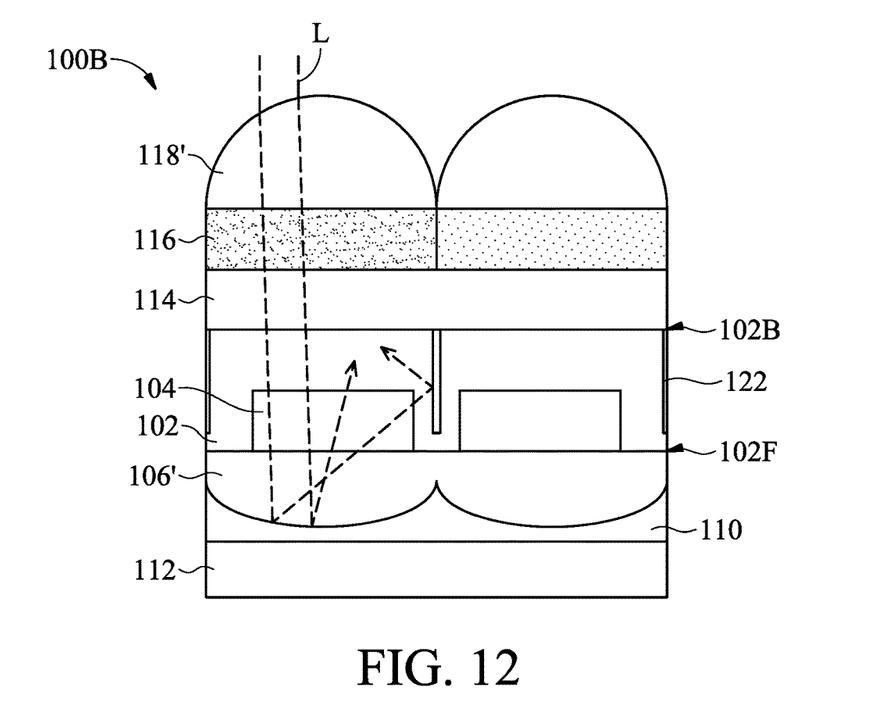
FIG. 12 is a cross-sectional view illustrating an image sensing device 100B in accordance with other embodiments of the present invention.

In some embodiments, as shown in FIG. 12, the image sensing device 100B further includes a deep trench isolation region 122 that is formed in the substrate 102 and between the photosensitive elements 104.

To be specific, prior to forming the dielectric layer 114, for example, the cross-sectional view of FIG. 6, a patterning process is performed. A photoresist material is formed on the back side 102 of the substrate 102 by a suitable process, such as spin coating or chemical vapor deposition, atomic layer deposition, physical vapor deposition, molecular beam deposition, plasma enhanced chemical vapor deposition, other suitable methods or a combination thereof. Then, optical exposure, post-exposure baking and development are performed to remove a portion of the photoresist material to form a patterned photoresist. The patterned photoresist layer will serve as a second hard mask 120 for etching. A bi- or tri-layered photoresist can be performed. Then, any acceptable etch process, such as reactive ion etching, neutral beam etching, similar etching, or a combination thereof is used to etch a portion of the substrate 102 to form trenches in the substrate 102 and between the photosensitive elements 104. In some embodiments, the trenches can pass through the substrate 102. Next, the patterned photoresist layer can be removed by etching or other suitable methods.

Next, an insulating material is filled into the trenches to form deep trench isolation regions 122 by a suitable deposition process, such as a chemical vapor deposition process, an atomic layer deposition process, a physical vapor deposition process, a molecular beam deposition process, a plasma enhanced chemical vapor deposition, or other suitable deposition processes or a combination thereof. In some embodiments, the insulating material of the deep trench isolation region 122 may be an insulating material such as silicon oxide, silicon nitride, silicon oxynitride or the like or a combination thereof.

As shown in FIG. 12, by disposing the deep trench isolation regions 122 between the photosensitive elements 104, the incident light L can be further prevented from being reflected by the reflection layer 110 to the photosensitive elements 104 in the other pixels. In some embodiments, the deep trench isolation regions 122 can pass through the substrate 102. The path of the incident light L is merely illustrative. One of ordinary skill in the art can understand that the deep trench isolation regions can be formed between appropriate process steps depending on the actual situation. For example, the deep trench isolation regions 122 can also be formed by etching the front side 102F of the substrate 102.

Figure 13:
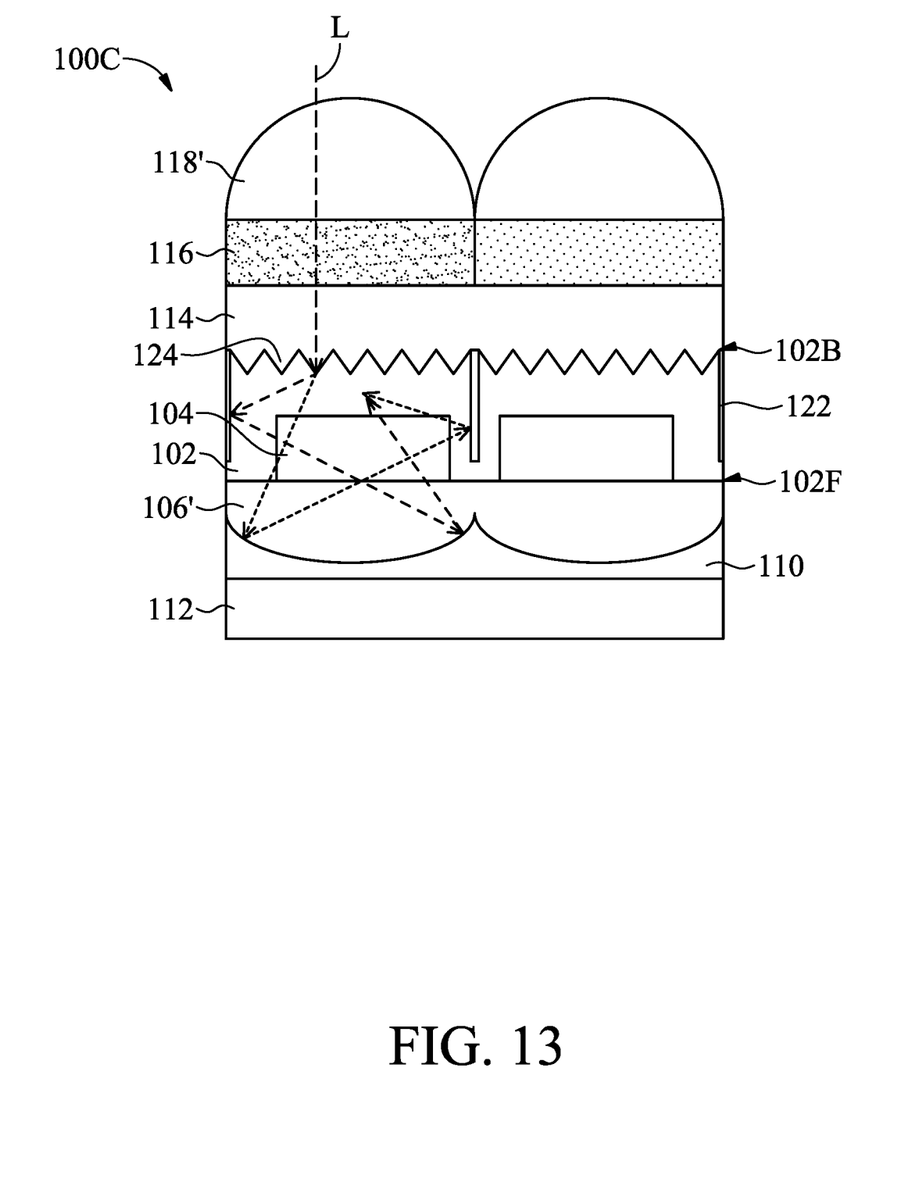
FIG. 13 is a cross-sectional view illustrating an image sensing device 100C in accordance with other embodiments of the present invention.

In some embodiments, referring to FIG. 13, the difference between FIG. 13 and FIG. 12 is that the image sensing device 100C further includes a subwavelength grating 124 formed on the back side 102B of the substrate 102 to scatter the incident Light L, which further increases the total absorption path of the incident light L. The path of the incident light L is merely illustrative. In some embodiments, the sub-wavelength grating 124 can be formed between the front side 102F of the substrate 102 and the reflection layer 110. For example, the deep trench isolation regions 122 and the sub-wavelength grating 124 may be formed in a cross-sectional view of FIG. 6. One of ordinary skill in the art can understand that deep trench isolation regions and sub-wavelength grating can be formed between appropriate process steps depending on the actual situation.

Compared to the prior art, the image sensing device provided by the embodiments of the present invention has at least the following advantages:

(1) By disposing a reflection layer having a parabolic surface on the front side of the substrate containing the photosensitive element, the incident light can be reflected back to the substrate after passing through the substrate, thereby increasing the absorption path of the incident light in the substrate containing the photosensitive element, thereby reducing energy loss in the wire layer. In addition, since the reflective layer has a parabolic surface, the incident light can be prevented from being reflected into other pixels, which further avoids crosstalk.

(2) In addition, by disposing the deep trench isolation regions between the photosensitive elements, the incident light can be further prevented from being reflected by the reflection layer to the photosensitive elements in the other pixels.

(3) Additionally, the incident Light L is scattered by forming a subwavelength grating on the back side of the substrate, which further increases the total absorption path of the incident light L, and by disposing a deep trench isolation region in the substrate, the energy loss in the wire layer can also be reduced and the incident light can be further prevented from being reflected to the photosensitive elements in other pixels.

Although the embodiments of the present invention and the advantages have been disclosed above, it should be understood that one of ordinary skill in the art can make changes, substitutions, and modification without departing from the spirit and scope of the present invention. In addition, the scope of the present invention is not limited to the process, machine, manufacture, compositions of matter, devices, methods and steps of particular embodiments described in the specification. Any one of ordinary skill in the art will readily appreciate from the disclosure of the present invention, processes, machines, manufacture, compositions of matter, devices, methods, or operations presently existing or later to be developed. As long as they can perform substantially the same functions or achieve substantially the same results in the embodiments described herein, they may be used according to the present invention. Accordingly, the scope of the present invention includes such processes, machines, manufacture, compositions of matter, devices, methods, or steps. In addition, each claim constitutes an individual embodiment, and the scope of the present invention also includes a combination of the claims and the embodiments. The features of the various embodiments can be arbitrarily mixed and used as long as they do not contradict or conflict the spirit of the invention.

What is claimed is:

1. An image sensing device, comprising:
   a substrate having a first pixel and a second pixel adjacent to the first pixel and having a front side and a back side opposite the front side;
   a plurality of photosensitive elements disposed in the substrate;
   a dielectric layer disposed on the back side of the substrate;
   a reflection layer disposed on the front side of the substrate and having a parabolic surface;
   a color filter layer disposed on the dielectric layer; and
   a microlens structure disposed on the color filter layer.

2. The image sensing device as claimed in claim 1, wherein the parabolic surface of the reflection layer has a curvature radius of between 0.3 μm and 10 μm.

3. The image sensing device as claimed in claim 1, further comprising a deep trench isolation region disposed in the substrate and between the plurality of photosensitive elements.

4. The image sensing device as claimed in claim 3, wherein the substrate comprises a subwavelength grating disposed on the back side of the substrate.

5. The image sensing device as claimed in claim 1, further comprising a deep trench isolation region disposed between the first pixel and the second pixel.

6. The image sensing device as claimed in claim 1, further comprising a wire layer disposed on the front side of the substrate.

7. The image sensing device as claimed in claim 6, wherein the reflection layer is disposed between the substrate and the wire layer.

8. The image sensing device as claimed in claim 1, wherein a material of the dielectric layer comprises $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, $AlSiN_3$, SiC, $Ta_2O_5$ or a combination thereof.

9. The image sensing device as claimed in claim 1, wherein the color filter layer comprises a plurality of color filter components.

10. The image sensing device as claimed in claim 1, wherein the reflection layer comprises copper, aluminum, molybdenum, tungsten, gold, chromium, nickel, platinum, titanium, tantalum, niobium, an alloy thereof or a combination thereof.

11. A method of forming an image sensing device, comprising:
    providing a substrate, wherein the substrate has a first pixel and a second pixel adjacent to the first pixel, and the substrate has a front side and a back side opposite the front side;
    forming a plurality of photosensitive elements in the substrate;
    forming a dielectric layer on the back side of the substrate;
    forming a reflection layer on the front side of the substrate, wherein the reflection layer has a parabolic surface;
    forming a color filter layer on the dielectric layer; and
    forming a microlens on the color filter layer.

12. The method as claimed in claim 11, wherein a curvature radius of the parabolic surface is between 0.3 μm and 10 μm.

13. The method as claimed in claim 11, further comprising forming a deep trench isolation region in the substrate and between the plurality of photosensitive elements.

14. The method as claimed in claim 13, further comprising forming a subwavelength grating on the back side of the substrate.

15. The method as claimed in claim 11, further comprising forming a deep trench isolation region between the first pixel and the second pixel.

16. The method as claimed in claim 11, further comprising forming a wire layer on the front side of the substrate.

17. The method as claimed in claim 16, wherein the reflection layer is disposed between the substrate and the wire layer.

18. The method as claimed in claim 11, wherein a material of the dielectric layer comprises $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, $AlSiN_3$, SiC, $Ta_2O_5$ or a combination thereof.

19. The method as claimed in claim 11, wherein the color filter layer comprises a plurality of color filter components.

20. The method as claimed in claim 11, wherein a material of the reflection layer comprises copper, aluminum, molybdenum, tungsten, gold, chromium, nickel, platinum, titanium, tantalum, niobium, an alloy thereof or a combination thereof.

* * * * *